US006696723B2

(12) United States Patent
Hartmann et al.

(10) Patent No.: US 6,696,723 B2
(45) Date of Patent: *Feb. 24, 2004

(54) ELECTRICALLY ERASABLE, PROGRAMMABLE, NON-VOLATILE MEMORY DEVICE COMPATIBLE WITH A CMOS/SOI PRODUCTION PROCESS

(75) Inventors: Joël Hartmann, Claix (FR); Marc Belleville, St. Egrève (FR)

(73) Assignee: Commissariat a l'Energie Atomique, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/123,472

(22) Filed: Jul. 28, 1998

(65) Prior Publication Data

US 2002/0038882 A1 Apr. 4, 2002

(30) Foreign Application Priority Data

Aug. 8, 1997 (FR) .............................. 97 10223

(51) Int. Cl.[7] .............................................. H01L 29/76
(52) U.S. Cl. ......................... 257/314; 257/57; 257/66; 257/314; 257/315; 257/316; 257/318; 438/257; 438/262
(58) Field of Search .............................. 257/314, 315, 257/316, 317, 318, 57, 66; 438/257, 262

(56) References Cited

U.S. PATENT DOCUMENTS

| 4,924,278 A | * | 5/1990 | Logie ........................ 357/23.5 |
| 5,291,047 A | * | 3/1994 | Iwasa ........................ 257/318 |
| 5,376,572 A | * | 12/1994 | Yang et al. ................. 437/43 |
| 5,395,777 A | * | 3/1995 | Yang ......................... 437/40 |
| 5,501,996 A | | 3/1996 | Yang et al. |
| 5,606,521 A | * | 2/1997 | Kuo et al. .................. 365/149 |
| 5,652,448 A | * | 7/1997 | Chang et al. ............... 257/315 |
| 5,736,765 A | * | 4/1998 | Oh et al. .................... 257/321 |
| 5,777,359 A | * | 7/1998 | Ra ............................. 257/314 |

(List continued on next page.)

FOREIGN PATENT DOCUMENTS

| EP | 0 682 370 | | 11/1995 | |
| EP | 0 712 163 | | 5/1996 | |
| FR | 2 726 935 | | 12/1996 | |
| JP | 405067791 | * | 5/1993 | .................. 257/314 |
| JP | 405121755 | * | 5/1993 | .................. 257/314 |
| JP | 405129614 | * | 5/1993 | .................. 257/314 |

OTHER PUBLICATIONS

"A novel cell structure for Giga–bit EPROM's and flash memoeris using polysilicon thin film transistors", S. Koyama, NEC Corporation, 1992.*

'Programming and erase with floating–body for high density low voltage flash EEPROM fabricated on SOI wafers', Chi et.al., National Semiconductor Corporation, 1995.*

"Design and performance of a new flash EEPROM on SOI (SIMOX) substrates", Zaleski et.al., 1994.*

(List continued on next page.)

Primary Examiner—George Eckert
Assistant Examiner—Edgardo Ortiz
(74) Attorney, Agent, or Firm—Oblon, Spivak, McClelland, Maier & Neustadt, P.C.

(57) ABSTRACT

The invention relates to an electrically erasable, non-volatile memory device, having a memory cell of the floating gate type (16), defined by a source zone, a drain zone, a channel zone (8) and a control gate zone (6), the latter being separated from the channel zone by an insulation zone (14), said five zones being implemented in a semiconductor film formed on an insulating layer (4), said memory cell being laterally insulated by one or more insulation zones (10, 12) in contact with the insulating layer.

13 Claims, 3 Drawing Sheets

U.S. PATENT DOCUMENTS

| | | | | |
|---|---|---|---|---|
| 5,780,893 A | * | 7/1998 | Sugaya | 257/318 |
| 5,801,415 A | * | 9/1998 | Lee et al. | 257/316 |
| 5,859,454 A | * | 1/1999 | Choi et al. | 257/316 |
| 5,861,653 A | * | 1/1999 | Hada | 257/386 |
| 5,925,906 A | * | 7/1999 | Tanaka | 257/314 |
| 5,929,479 A | * | 7/1999 | Oyama | 257/315 |
| 5,959,328 A | * | 9/1999 | Krauscheneider et al. | 257/314 |
| 5,973,356 A | * | 10/1999 | Noble et al. | 257/319 |
| 6,017,792 A | * | 1/2000 | Sharma et al. | 438/257 |

OTHER PUBLICATIONS

K. Ohsaki, et al., IEEE Journal of Solid–State Circuits, vol. 29, No. 3, pp. 311 to 316, "A Single Poly EEPROM Cell Structure for use in Standard CMOS Processes", Mar. 1994.

J. Miyamoto, et al., IEEE Journal of Solid–State Circuits, vol. SC–21, No. 5, pp. 852 to 859, "An Experimental 5–V–Only 256–kbit CMOS EEPROM with a High–Performance Single–Polysilicon Cell", Oct. 1986.

* cited by examiner

ELECTRICALLY ERASABLE, PROGRAMMABLE, NON-VOLATILE MEMORY DEVICE COMPATIBLE WITH A CMOS/SOI PRODUCTION PROCESS

TECHNICAL FIELD AND PRIOR ART

The present invention relates to a bit by bit selectively and electrically erasable, programmable, non-volatile memory device (EEPROM). The use of a standard CMOS/SOI technology, i.e. without any specific technological stage, makes it possible to envisage the integration of such EEPROM memory cells into CMOS logic circuits without any modification of the production technology.

Electrically erasable, programmable, non-volatile memories have existed since the mid-1970's (FLOTOX cell invented by INTEL). They are characterized by a manufacturing process having two polycrystalline silicon levels (floating gate and control gate), generally high erasing and programming voltagegs (>15 V) and a complex memory cell with an access transistor, a double gate transistor and an erasing zone with a very small gate oxide thickness (tunnel oxide).

For reasons of technological complexity and the large surface area of the memory cell, this type of product has evolved little as regards production volume and integration density. The maximum densities are approximately 256 Kbits. At the same time, EPROMs and more recently flash EPROMs have undergone a considerable economic development, as well as a rapid evolution towards high integration densities (nowadays>16 Mbits). However, the need to integrate non-volatile memory functionalities on logic circuits very rapidly became apparent in the mid-1980's, particularly with the introduction of the first microcontrollers. In order to rapidly reprogram these memory cells, it has been necessary to be able to electrically erase them, which has made the EEPROM more attractive than the EPROLM for this application. From the standpoint of operation between the memory zone and the logic circuit, it has proved useful to be able to erase the said memory cells selectively and independently of one another, so that an EEPROM has proved of greater interest than a flash EPROM. Finally, for process compatibility and production cost reasons, it is very advantageous to have a CMOS process permitting both the implementation of the EEPROM plane and the logic part with minimum technological modifications. This has led to the interest in single poly EEPROM cells, i.e. having a single polycrystalline silicon level. Numerous memory cells of this type have been disclosed in journals and scientific conferences in the field.

The article by J. I. Miyamoto et al entitled "Experimental 5V only 256 kbits CMOS EEPROM with a high performance single polysilicon cell" published in IEEE Journal of Solid-State Circuits, vol. SC-21, No. 5, 1986, pp 852–859 describes a memory cell having a single polycrystalline silicon level, which uses a $N^+$ diffusion zone as the control gate and the single polycrystalline silicon level for the MOS gate of the logic part and for the floating gate of the EEPROM plane. Despite an interesting functionality and a current use of this type of memory cell in the implementation of integrated circuits, this type of memory cell is limited as regards the integration density, bearing in mind its large surface area (cell size approximately 100 $\mu m^2$ for a 1.2 $\mu m$ technology and 70 $\mu m^2$ for a 0.7 $\mu m$ technology). Moreover, as in double poly EEPROMs, this type of structure suffers from a tunnel oxide reliability problem linked with the large surface of the tunnel oxide zone. Finally, such a memory cell requires high programming voltages, as well as a special insulation of the $N^+$ zone defining the control gate.

The article by K. Ohsaki et al entitled "A single poly EEPROM cell structure for use in standard CMOS process" published in IEEE Journal of Solid-State Circuits, vol. 29, No. 3, pp 311–316, 1994 describes another type of EEPROM cell, which also uses a single polycrystalline silicon level. Its special feature is the use of a CMOS process on conventional solid silicon (without specific technological stages), the memory cell being constituted by a MNOS transistor and a PMOS transistor, which are adjacent and, which have common gates. These gates are in fact floating gates. The inversion layer beneath the PMOS transistor, as well as the $P^+$ S/D diffusion serve as a control gate. The source and drain zones of the NMOS transistor are connected to earth or ground. The size of the cell is more compact (31 $\mu m^2$ for 0.8 $\mu m$ design rules), but it suffers from a considerable minimum distance to be respected between the NMOS transistor and the PMOS transistor in order to avoid any latch-up risk. Finally, this memory cell has no selection transistor, as in the article by Miyamoto et al, and consequently requires either a collective reading of the memory cells, or a collective erasing.

French patent application 2 726 935 also describes a memory cell implemented in a SOI (silicon on insulator) structure. However, the technology used in this document corresponds to a solid silicon technology. Thus, insulation or isolation trenches are required for insulating the memory cells.

DESCRIPTION OF THE INVENTION

The present invention relates to a non-volatile memory cell, e.g. of the electrically bit by bit programmable and erasable EEPROM type and having the special feature of being conventionally implementable in a CMOS/SOI process. In addition, the memory cell surface area is preferably small.

More specifically, the invention relates to an electrically erasable, non-volatile memory device, having a memory cell of the floating gate type, defined by a source zone, a drain zone, a channel zone and a control gate zone, the latter being separated from the channel zone by an insulation zone, said five zones being implemented in a semiconductor film formed on an insulating layer, said memory cell being laterally insulated by one or more insulation zones in contact with the insulating layer.

The invention also relates to an electrically erasable, non-volatile memory device having, in a semiconductor film separated by an insulating layer from a substrate, at least one memory cell laterally insulated by insulation zones in contact with the insulating layer, said memory cell comprising a transistor, whose control gate is implemented by a diffusion zone in the semiconductor film, the floating gate being formed above a channel zone implemented in the semiconductor film between a source zone and a drain zone and above the control gate.

This device has a direct lateral insulation from the memory cell by insulation zones. It consequently requires no insulation trenches.

Moreover, the structure according to the invention only requires one semiconductor film of limited thickness, of a few tenths of a $\mu m$ (e.g. 0.1 to 0.3 $\mu m$), which can be very advantageously compared with the thickness of 1 to 2 um required in the device described in FR-2 726 935.

The dielectric insulation of the components obtained as a result of the insulation zones is of a total nature and makes it possible to reduce to the minimum the insulation distance between the transistors, in a device having several memory cells.

According to a first embodiment, the insulation zones of the memory cell are implemented by a field oxide.

According to another embodiment, the insulation zones of the memory cell are implemented by the localized etching of the semiconductor film down to the insulating layer.

The storage device according to the invention solely uses transistors of a single conductivity type in the memory plane, no matter whether they are storage or selection transistors. This leads to a simplification in the production processes compared with a NMOS and PMOS memory cell requiring a dual $N^+$ and $P^+$ gate.

The total dielectric insulation of the control gate implemented in diffusion makes it possible to use a control voltage of random sign (positive or negative), as well as high control voltage values without any risk of latch-up or electric leaks.

A selection transistor can be used in conjunction with each memory cell. In particular, a selection gate of the selection transistor, connected to the information storage zone, permits the selection in writing, reading or erasing of only the considered memory cell.

A selection transistor can also be associated with a plurality of memory cells in order to permit the control and/or erasing of said plurality of memory cells.

The invention also relates to a process for implementing such a structure, comprising the following stages:
  formation of a substrate by producing a semiconductor film on a stack formed by an electrically insulating layer and a support,
  formation of an insulation zone in contact with the electrical insulating layer,
  producing a channel zone and a control gate zone, by the successive doping of ions in the semiconductor film, said zones being insulated by the insulation zones,
  producing a floating gate, above the channel zone and the control gate zone and insulated from the channel zone and the gate zone,
  producing a drain zone and a source zone by doping ions in the semiconductor film on either side of the floating gate,
  producing connections connected respectively to the drain zone, the source zone and the control gate zone.

BRIEF DESCRIPTION OF THE DRAWINGS

The invention is described in greater detail hereinafter relative to non-limitative embodiments and with reference to the attached drawings, wherein show.

DETAILED DESCRIPTION OF EMBODIMENTS OF THE INVENTION

Figure 1:
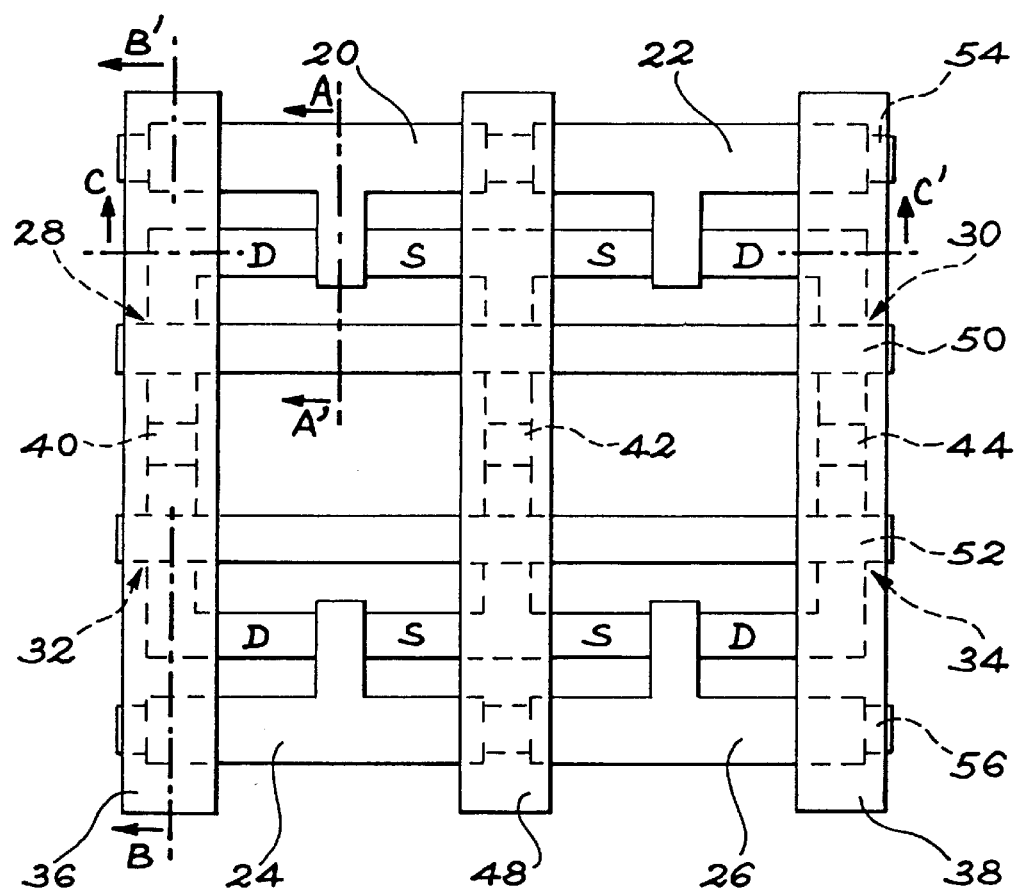
FIG. 1 Diagrammatically and in plan view a device according to the invention having a plurality of memory cells.

FIG. 1 is a plan view of an embodiment of a device according to the invention.

Figure 2A:
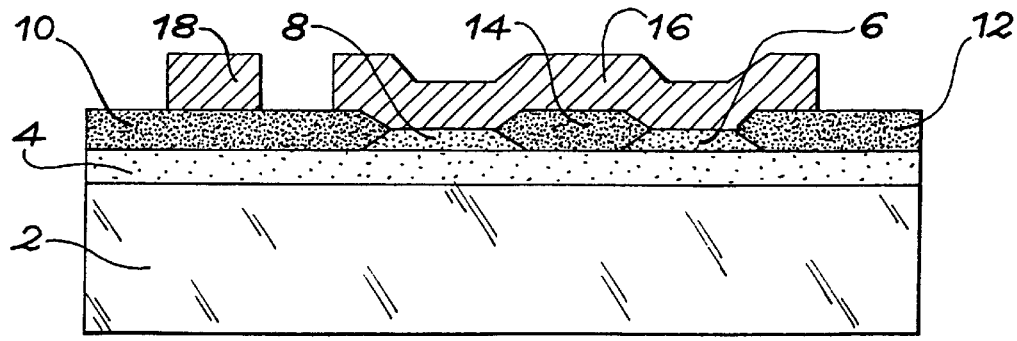
FIGS. 2A to 2C Diagrammatic sections of a memory device according to the invention, respectively along planes AA', BB' and CC' in FIG. 1.

A first section along AA' of said device is illustrated in FIG. 2A, which shows a memory cell of a non-volatile memory device, implemented on a substrate 2, e.g. of solid silicon. This substrate of the SIMOX (or wafer bonding) type is covered with a buried oxide layer 4 having a thickness of approximately 400 nm. The assembly is surmounted by an active, semiconductor layer 6, 8, e.g. of silicon, having a thickness of a few $\frac{1}{10}$ μm, e.g. between 0.1 and 0.3 μm (e.g. 0.2 μm).

References 6 and 8 respectively designate a control gate zone (with $p^+$ doping implemented in a semiconductor, active layer P) and a P-type channel zone of the storage transistor. These two elements are separated by an insulation zone 14. In exemplified manner, the insulation zones are implemented by field oxides. The channel and control gate zones are surmounted by a floating gate 16. On either side, field oxide zones 10, 12, in contact with the buried oxide layer 4, insulate the device from its environment.

Figure 2B:
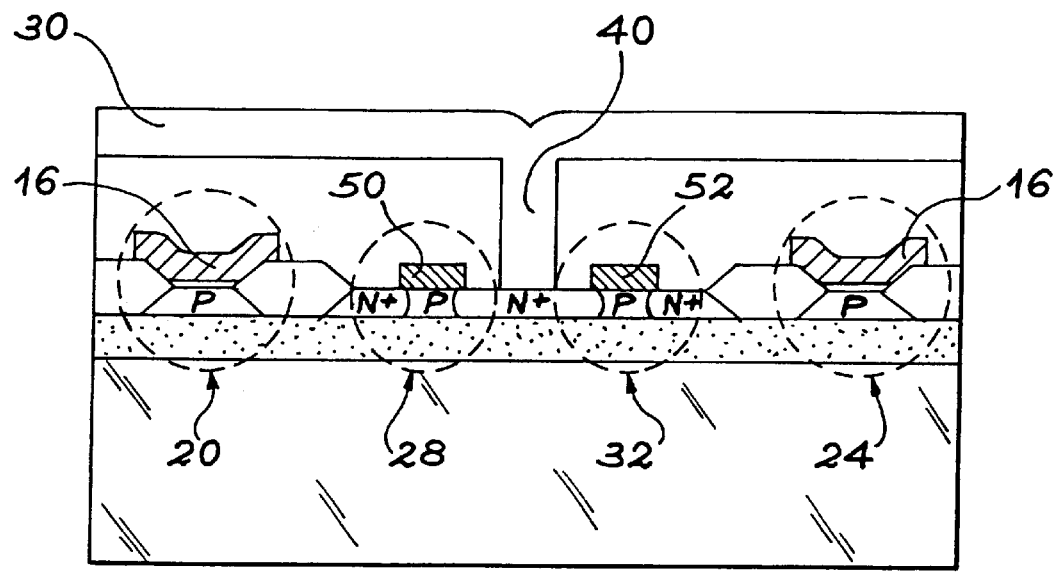
Figure 2C:
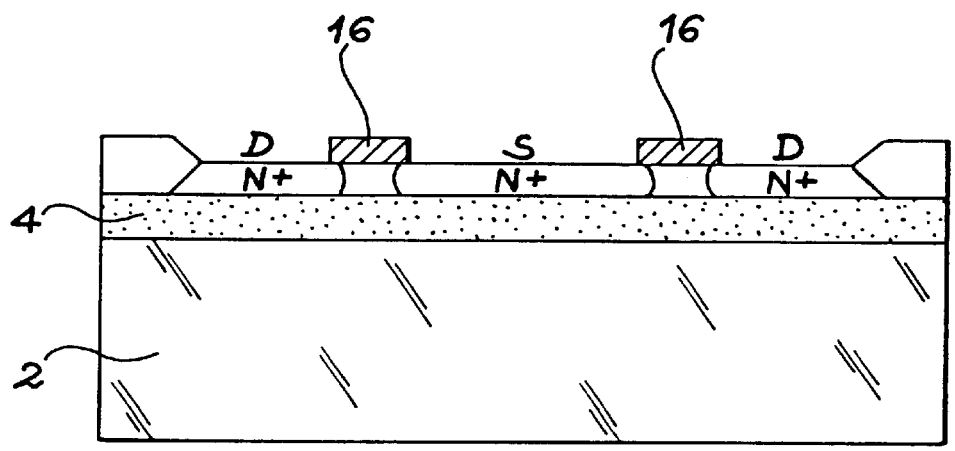

Source S and drain D zones are defined by $N^+$ doping on either side of the floating gate 16, as illustrated in FIGS. 1 and 2C.

Reference 18 designates the gate of a selection transistor associated with the memory cell shown. This selection transistor is shown in FIG. 2B, which corresponds to the section along plane BB' in FIG. 1. The control gates 16 of the selection transistors 28, 32 coincide with the word lines 50 and 52.

On either side of the control gate in the semiconductor film, said selection transistor has a source and a drain advantageously produced at the same time as those of the storage transistor. The source (respectively the drain) of the selection transistor is in an active zone common to the drain (respectively source) of the storage transistor.

In the same way, the control gate and the gate oxide of the selection transistor are advantageously produced at the same time as the gate oxide and the floating gate of the storage transistor.

Thus, in a semiconductor film separated by an insulating layer 4 from the remainder of the substrate 2 (SOI-type structure), the device according to the invention has at least one memory cell laterally insulated by field oxides 10, 12 in contact with the insulating layer 4. This memory cell incorporates a transistor, whose control gate 6 is implemented by a diffusion zone in the film, the floating gate 16 being formed above a channel zone 8 implemented in the semiconductor film between the source zone S and a drain zone D and above the control gate.

An example of the process for producing such a structure will now be described. This process can comprise a prior adjustment of the doping of the semiconductor film, which is in this example of the P type, by ionic implantation of boron, followed by annealing in the furnace. The insulation zones 12, 14 are produced by a conventional LOCOS-type process ("Localized Oxidation of Silicon"). The field oxide of said insulation reunites, after thermal growth, the buried oxide of the SOI-type substrate, thus permitting a total dielectric insulation between the MOS components. This is followed by sacrificial oxidation, adjustment of the P doping of the channel and control gate and oxidation of the gate or gates of the memory plane. This is followed by the respective definition of the gate or gates of the memory plane by deposition of phosphorus-doped, polycrystalline silicon. These gates are defined by a photoengraving state, followed by dry, anisotropic, plasma etching. This is followed by the N implantation of the source and drain of the memory plane, followed by annealing. This stage can be completed by a LDD-type implantation. This is followed by interconnections by deposition and the creep or flow of a glass doped with boron and phosphorus in order to ensure the insulation between the gates and the metal level, followed by the photoengraving of the contact holes, metallization of the contacts by depositing a Ti/TiN barrier, tungsten filling and deposition of an Al—Cu alloy with 0.5% Cu. After metal level photoengraving, there is a deposition of a passivation layer constituted by a phosohorus-doped glass, followed by, the photoengraving of the openings of the welding contact pieces.

The process for the production of the memory plane is perfectly integrated into a process for the production of a CMOS-type integrated circuit. In other words, the elements of the integrated circuit, other than the memory plane, are produced at the same time as the latter. For example, the source and drain doping of the integrated circuit transistors takes place during the coping of the sources and drain,s of the memory plane.

FIG. 1 shows a storage device having four storage transistors 20, 22, 24, 26 according to the invention and having the structure described hereinbefore. Each of these memory cells is associated with a selection transistor 28, 30, 32, 34.

By means of contact zones 40, 44, the bit lines 36, 38 link the drains of the memory cells 20, 22, 24, 26. By a contact zone 42, a source line 48 links the sources of the memory cells 20, 22, 24, 26. Word lines 50, 52 control the selection transistors 28, 30, 32, 34, which themselves control the control gates of the storage transistors.

Write and erase lines 54, 56 permit the programming of the memory cells and/or their collective or individual erasing:

- a cell is programmed by hot carriers, by applying a programming voltage to a write and erase line, selecting the corresponding access transistor by control gate and applying a drain voltage to the corresponding bit line,
- collective erasing by applying a high positive voltage to a write and erase line (erasing by the Fowler-Nordheim effect between the gate and channel of the cells common to the same write and erase line)—it also being possible to erase a cell individually, like an EEPROM, by applying a slight negative voltage to its write and erase line and applying a positive voltage to the bit line (erasing by Fowler-Nordheim effect between the gate and drain).

Therefore each memory cell is formed by a selection transistor and a charge storage transistor, whose gate is floating. The selection transistor makes it possible to selectively address bit by bit the memory plane with the aid of a control ate and a bit line. This selection transistor makes it possible to eliminate all parasitic phenomena disturbing neighbouring cells during the programming and/or erasing of a given cell of the memory plane. The memory cell structure according to the invention makes it possible to move the access transistor much closer to the storage transistor and therefore significantly reduce the surface area of the memory cell. Programming and erasing are controlled by a programming line, implemented by a diffusion zone in the silicon substrate. The earth or ground connection is ensured by an earth or ground line 48 contacted with each selection transistor. The technology advantageously uses a silicon on insulator or SOI substrate making it possible to polarize the programming-erasing line either with a positive or a negative value, without any risk of parasitic electrical conduction of underlying junctions, as would fatally be the case for a technology on solid substrate. Moreover, the use of a SOI-type substrate makes it possible to move the active zones of opposite conduction types to the minimum distance authorized by engraving, without any risk of latch-up, which is well known in conjunction with technology on solid substrate.

Different operating modes for the memory cell will now be considered.

When reading, in order to access a memory cell, a nominal, positive voltage (5 V for 0.7 um, 3.3 V for 0.5 and 0.35 um and 2.5 V for 0.25 um) is applied to the corresponding control gate. A weak positive voltage (approximately 1 V) is applied to the corresponding bit line and a voltage of 0 V (earth) is applied to the corresponding earth line. Under these conditions, the access transistor at this memory cell is rendered conductive and the bit line voltage is transmitted to the information storage transistor. This floating gate transistor (unconnected to an electrode) covering both a channel zone on the side of the selection transistor and a channel zone on the side of the writing-erasing gate 6 or 54. A nominal, positive voltage is also applied to said writing-erasing ate. If the floating gate is not charged with electrons, the storage transistor will be made conductive by said nominal voltage and an electrical current will flow between the corresponding bit line and the earth line. A logic level 1 could be read. However, if the floating gate has previously been charged with electrons, there will be a threshold voltage shift of the storage transistor and the nominal voltage on the writing-erasing gate will not be adequate to make said transistor conductive. No current can then flow between the bit line and the earth line and then a logic level 0 could be read.

The programming of the storage transistor or the injection of electrons into its floating gate is implemented in the following way. For reading access to a memory cell, a nominal, positive voltage is again applied to the control gate. A strong, positive voltage (a few volts) is applied to the corresponding bit line and a voltage of 0 V (earth) is applied to the earth line. Under these conditions, the access transistor to the memory cell is made conductive and the bit line voltage is transmitted to the drain of the information storage transistor. A high, positive voltage is then applied to the corresponding writing-erasing line, so as to render conductive the storage transistor under saturation conditions. As in an EPROM, hot (high energy) carriers are then injected into the floating gate, until there is an adequate shift or offset of the threshold voltage of said transistor. It is possible to reduce the value of the voltage applied to the writing-erasing line by increasing the surface area of the floating gate facing said programming line, compared with the surface area of the floating gate facing the active zone on the side of the selection transistor. This area increase has the effect of increasing the capacitive coupling between the floating gate and the writing-erasing line, i.e. of increasing the value of the voltage applied by capacitive coupling to the floating gate during the programming phase.

In order to erase a memory cell, i.e. remove the electrons previously stored in the floating gate of said memory cell, the following procedure is adopted. A nominal, positive voltage is still applied to the corresponding control gate. A high, positive voltage (a few volts) is then applied to the corresponding bit line and a voltage of 0 V is applied to the corresponding earth line. Under these conditions, the access transistor to the memory cell is rendered conductive and the bit line voltage is transmitted to the information storage transistor.

A slightly negative voltage is then applied to the writing-erasing line 6 or 54. A high electrical field then appears between the floating gate and the drain of the storage transistor and an electric current traversing the gate oxide discharges the electrons from the floating gate. This erasing procedure makes it possible to eliminate the floating gate electrons, selectively in the selected memory cell. Thus, the low negative value applied to the writing-erasing line with respect to the other cells adjacent to the considered memory cell, is not adequate to discharge any neighbouring programmed cells.

Conversely, if it is wished, as a function of the envisage application, to collectively erase a plurality of memory cells, or even the entire memory plane, it is then possible to apply a high, positive voltage to a writing-erasing line, as well as a zero voltage to the bit line. The earth line and word line polarization conditions remain unchanged. The polarization conditions around the storage transistor are then reversed compared with the programming phase. The electrons stored in the floating gate are discharged by conduction across the gate oxide of the memory cell to the programming-erasing electrode. All the cells adjacent to the cell N and already programmed are collectively erased by conduction to the programming-erasing electrode.

Figure 3:
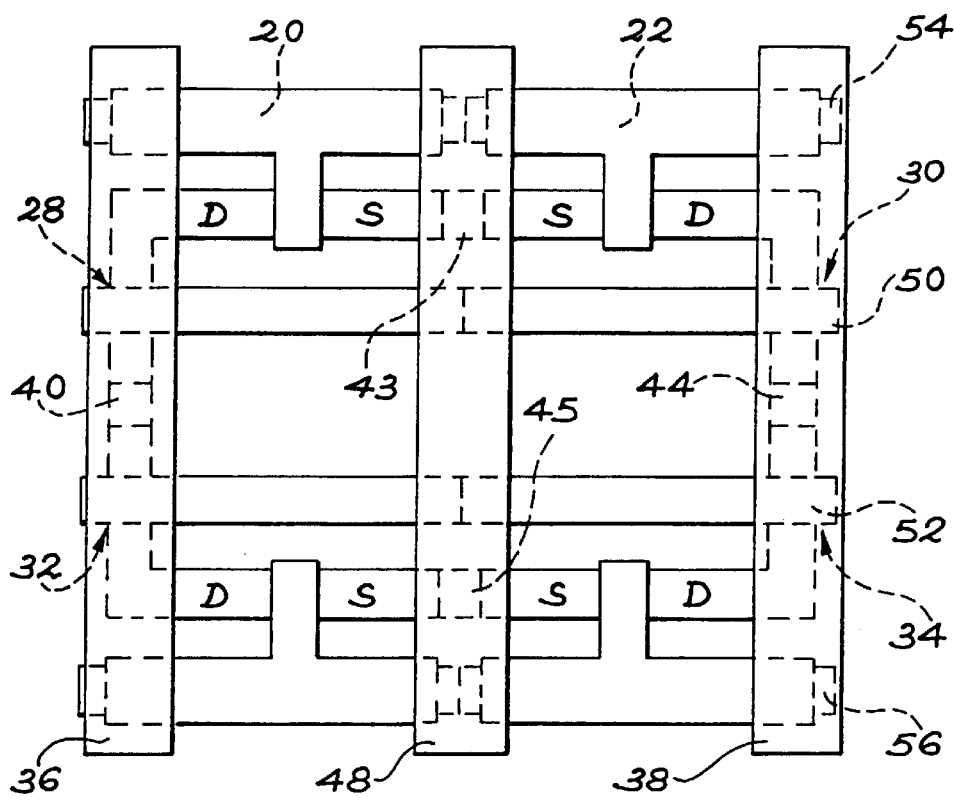
FIGS. 3 & 4 Other embodiments of a device according to the invention having a plurality of memory cells.

FIG. 3 illustrates another embodiment of the invention, in which identical number or letter references to those of FIG. 1 designate identical or corresponding elements. The source contact zones 43, 45 are positioned differently compared with the embodiment of FIG. 1. Thus, the source is common to several memory cells and to the same potential for said cells.

Figure 4:
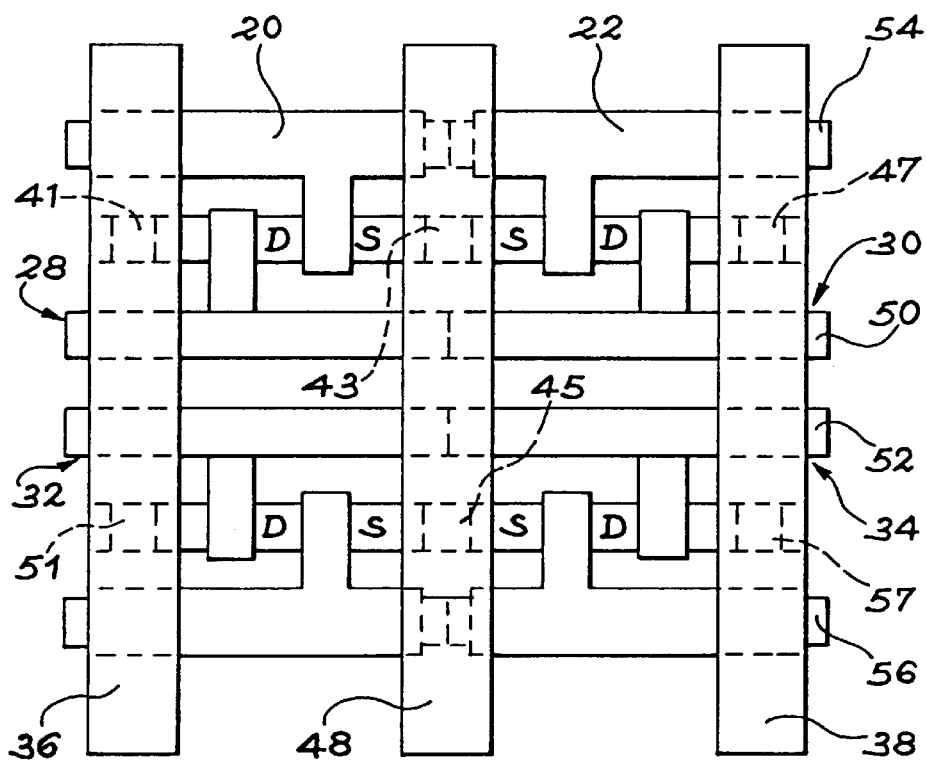

FIG. 4 shows a variant of the embodiment described. The operating principle is the same, but there is a different distribution of contact points. In particular, the contact zones, 41, 51, 47, 57 of the bit lines 36, 38 on each of the memory cells correspond to the contact zones 40, 44 of FIGS. 2 and 3.

What is claimed is:

1. Electrically erasable, non-volatile memory device, comprising:
   a memory cell of the floating gate type, including,
      a source zone,
      a drain zone,
      a channel zone in a first plane and abutting an insulation zone, and
   a control gate zone, said control gate zone in the first plane and abutting the insulation zone,
   wherein said source, drain, channel, control gate, and insulation zones are formed in a semiconductor film formed on an insulating layer and said memory cell being laterally insulated by one or more insulation zones in contact with the insulating layer.

2. Electrically erasable, non-volatile memory device comprising:
   a semiconductor film separated by an insulating layer from a substrate, said semiconductor film including,
      at least one memory cell laterally insulated by insulation zones in contact with the insulating layer,
   wherein said memory cell comprises a transistor whose control gate is formed by a diffusion zone in a first plane in the semiconductor film and a floating gate formed above a channel zone formed in the semiconductor film between a source zone and a drain zone and above the control gate, the channel zone is formed in the first plane, and the control gate and the channel zone have a substantially equal thickness.

3. The device according to one of the claims 1 or 2, wherein the insulation zones are formed by a field oxide.

4. The device according to one of the claims 1 or 2, wherein the insulation zones are formed by a localized engraving of the semiconductor film down to the insulating layer.

5. The device according to one of the claims 1 or 2, wherein the semiconductor film comprises silicon.

6. The device according to one of the claims 1 or 2, wherein the semiconductor film has a thickness of no greater than 0.3 um.

7. The device according to claim 6, wherein the semiconductor film has a thickness between 0.1 um and 0.3 um.

8. The device according to claims 1 or 2, wherein the memory cell includes a selection transistor.

9. Non-volatile memory device comprising a plurality of devices according to one of the claims 1 or 2, each memory cell being associated with a selection transistor to permit the control and/or erasing of said memory cell.

10. A storage device comprising:
    a plurality of electrically erasable, non-volatile memory devices, having a memory cell of the floating gate type, said memory cell including,
       a source zone,
       a drain zone,
       a channel zone formed in a first plane and abutting an insulation zone, and
       a control gate zone, the control zone formed in the first plane and abutting the insulation zone,
    wherein said source, drain, channel, control gate, and insulation zones are formed in a semiconductor film formed on an insulating layer, said memory cell being laterally insulated by one or more insulation zones in contact with the insulating layer, and a selection transistor being associated with a plurality of memory cells is configured to permit at least one of the control and erasing of said plurality of memory cells.

11. A storage device comprising:
    a plurality of electrically erasable, non-volatile memory devices located in a semiconductor film separated by an insulating layer from a substrate, said plurality including,
       at least one memory cell laterally insulated by insulation zones in contact with the insulating layer,
       wherein said memory cell includes a transistor whose control gate is formed by a diffusion zone in a first plane in the semiconductor film, a floating gate is formed above a channel zone formed in the semiconductor film between a source drain and a drain zone and above the control gate, a selection transistor is associated with a plurality of memory cells in order to permit at least one of the control and erasing of said plurality of memory cells, and the channel zone is formed in the first plane, and the control gate and the channel zone have a substantially equal thickness.

12. The device according to claim 1, wherein said control gate is separated from the channel zone only by the insulation zone.

13. The device according to claim 10, wherein said control gate is separated from the channel zone only by the insulation zone.

* * * * *